US008116468B2

(12) United States Patent
Katayama

(10) Patent No.: US 8,116,468 B2
(45) Date of Patent: Feb. 14, 2012

(54) STEREOPHONIC SOUND REPRODUCTION DEVICE

(75) Inventor: Masaki Katayama, Hamamatsu (JP)

(73) Assignee: Yamaha Corporation (JP)

( * ) Notice: Subject to any disclaimer, the term of this patent is extended or adjusted under 35 U.S.C. 154(b) by 1229 days.

(21) Appl. No.: 11/576,224

(22) PCT Filed: Aug. 11, 2005

(86) PCT No.: PCT/JP2005/014786

§ 371 (c)(1), (2), (4) Date: Jul. 10, 2007

(87) PCT Pub. No.: WO2006/038380

PCT Pub. Date: Apr. 13, 2006

(65) Prior Publication Data

US 2008/0247553 A1 Oct. 9, 2008

(30) Foreign Application Priority Data

Sep. 30, 2004 (JP) ................................ 2004-288203

(51) Int. Cl.
*H03G 3/00* (2006.01)
*H04R 5/00* (2006.01)

(52) U.S. Cl. ........................................... 381/63; 381/17

(58) Field of Classification Search .................... 381/63, 381/61, 17; 84/630, DIG. 26
See application file for complete search history.

(56) References Cited

U.S. PATENT DOCUMENTS

| | | | | |
|---|---|---|---|---|
| 4,472,993 | A * | 9/1984 | Futamase et al. | 84/629 |
| 6,782,105 | B1 * | 8/2004 | Sahara et al. | 381/63 |
| 7,062,337 | B1 * | 6/2006 | Blesser | 700/94 |
| 2002/0106090 | A1 | 8/2002 | Dahl et al. | |
| 2005/0063551 | A1 * | 3/2005 | Cheng et al. | 381/18 |

FOREIGN PATENT DOCUMENTS

| | | | |
|---|---|---|---|
| EP | 1194006 | A2 | 4/2002 |
| GB | 210613 | A | 2/1983 |
| GB | 2345622 | A | 7/2000 |
| JP | 1-57799 | B2 | 12/1989 |
| JP | 07-176989 | A | 7/1995 |

(Continued)

OTHER PUBLICATIONS

International Search Report and Written Opinion issued in corresponding International Application No. PCT/JP2005/014786, with mailing date Oct. 25, 2005. (English Translation of the Relevant Portion of International Search Report is provided).

Kuttruff, Heinrich, "Room Acoustics", Fourth Edition, 2000 Spoon Press, XP000002657636, ISBN 0-419-24580-4 (Cited in Ext. European Search Report issued for corresponding EP Patent Application No. 05770487.6).

(Continued)

*Primary Examiner* — Hai Phan

(74) *Attorney, Agent, or Firm* — Rossi, Kimms & McDowell LLP

(57) ABSTRACT

A stereophonic sound reproduction device has a sound amplifying device that amplifies multi channel surround sound signals for respective channels and outputs the multi channel surround sound signals to a plurality of speakers that are located surrounding a listening position, and a rear reverberation creation device, in the rear reverberation creation device, convolution computations are performed on direct sound or initial reflected sound contained in the sound signals of the respective channels of multi channel surround sound signals, and reverberation groups that have flat frequency characteristics and have non-uniform delay time intervals, and that have different delay time intervals for the respective channels while having the same envelope characteristics for the respective channels are created and output for the respective channels.

4 Claims, 6 Drawing Sheets

FOREIGN PATENT DOCUMENTS

| | | | |
|---|---|---|---|
| JP | 7-221576 | A | 8/1995 |
| JP | 8-37700 | A | 2/1996 |
| JP | 2000-069599 | A | 3/2000 |
| JP | 2000-138998 | A | 5/2000 |
| JP | 2000-163086 | A | 6/2000 |
| JP | 2004-159037 | A | 6/2004 |
| WO | 2005048653 | A1 | 5/2005 |

OTHER PUBLICATIONS

Fischetti, Antonio, "Caracteristiques d'une salle", Initiation a l'acoustique, 2003, Belin, Paris, XP000002657635, ISBN 2-7011-3695-4 (Cited in Ext. European Search Report issued for corresponding EP Patent Application No. 05770487.6).

Extended European Search Report issued for corresponding EP Patent Application No. 05770487.6.

* cited by examiner

STEREOPHONIC SOUND REPRODUCTION DEVICE

This application is a U.S. National Phase Application of PCT International Application PCT/JP2005/014786 filed on Aug. 11, 2005.

TECHNICAL FIELD

The present invention relates to a stereophonic sound reproduction device that, in a stereophonic sound reproduction device that outputs multi-channel surround sound signals to a plurality of speakers that are connected to a main unit, creates an excellent correlation between each speaker that is connected to the main unit.

This application claims priority from Japanese Patent Application No. 2004-288203, filed Sep. 30, 2004, the contents of which are incorporated herein by reference.

BACKGROUND ART

In recent years there has been an increase in users who install a multi-channel surround system in their living room and using this as a home theater enjoy contents such as movies and music as a family. If a user operates the equipment of this multi-channel surround system and reproduces contents that include multi-channel surround sound such as, for example, a DVD, multi-channel surround sound is output from a plurality of speakers that are located around a listening position. As a result, the user is able to enjoy contents at an impact level similar to that enjoyed in a cinema or concert hall.

Among conventional multi-channel surround systems there are those that, in order to improve acoustics, are provided with a sound field compensation circuit that is able to automatically set a hall simulation mode that reproduces the acoustics of a concert hall (or theater) in accordance with the music genre of input music signals (see, for example, Patent Document 1).

Moreover, among conventional multi-channel surround systems there are those that, in order to make it possible to create an excellent reproduction sound field at a listening position, are provided with an automatic acoustic control function that automatically sets control parameters for control to be performed on the sound signals of each channel (see, for example, Patent Document 2).

[Patent Document 1] Japanese Unexamined Patent Application, First Publication No. H8-37700

[Patent Document 2] Japanese Unexamined Patent Application, First Publication No. 2004-159037

However, in the sound field compensation circuit described in Patent Document 1, while the acoustics of a concert hall (or theater) are reproduced, the frequency characteristics of the reproduced acoustics are not flat. Because of this, while the sound correlation between each speaker is improved, because the optional sound field such as the hall is changed, the feeling of that sound field that is included in the original contents is lost.

In the acoustic control device described in Patent Document 2, acoustic analysis for the acoustic control and the creation of control parameters can be performed rapidly, so that the optimum control can be implemented for the sound signals of each channel. However, because a plurality of speakers are used in a home theater, the type and size of each speaker are often different. If, in this manner, the type and size of each speaker differs for each channel, then it is difficult to perfectly match speaker characteristics even if acoustic control is performed using an acoustic control device such as that described above, and a certain amount of unevenness remains. Because of this, the problem arises that the sound correlation between each speaker is not particularly good even if acoustic control has been performed. Moreover, depending on the configuration of the room where the home theater is installed, there may be a sizeable distance between the front speakers and rear speakers, so that reflected waves in the room may have a considerable effect. In this case as well, the problem arises that the sound correlation between speakers is not particularly good.

DISCLOSURE OF INVENTION

It is therefore an object of the present invention to provide a stereophonic sound reproduction device that makes it possible to have an excellent sound correlation between each speaker outputting multi-channel surround sound.

This invention is provided with the following structure as a means of solving the above described problems.

(1) There are provided: a sound amplifying device that amplifies multi channel surround sound signals for respective channels and outputs the multi channel surround sound signals to a plurality of speakers that are located surrounding a listening position; and a rear reverberation creation device that has filter devices for the respective channels whose delay time intervals are non-uniform that are different for the respective channels and whose envelope characteristics are the same for the respective channels, performs convolution computations on the multi channel surround sound signals using the filter devices that correspond to the respective channels, creates rear reverberation groups, and outputs the rear reverberation groups to the sound amplifier device.

In this structure, rear reverberation groups whose envelope characteristics are the same in each channel are attached to surround sound. Accordingly, by attaching rear reverberation groups whose envelope characteristics are the same to each channel of multi channel surround sound, it is possible to attach rear reverberation that all has the same atmosphere to sounds that are output from each speaker that is connected to the stereophonic sound reproduction device. As a result, it is possible to form an excellent correlation between the sounds output from each speaker. Moreover, because the rear reverberation groups that are attached to each channel have non-uniform delay time intervals that are different for each channel, it is possible to prevent the rear reverberation of each channel becoming monaural and a natural sound atmosphere can be imparted.

(2) The filter devices are cascade type finite impulse response (FIR) filters that perform the convolution computations.

In this structure, because the convolution computations are performed by cascade type FIR filters, it is possible to reduce the number of computation elements compared with when the convolution computation is performed by a single FIR filter. Accordingly, the structure can be simplified and the amount of computation processing can be reduced.

(3) The rear reverberation creation device is provided with a delay time switching device that is able to alter delay time intervals of the rear reverberation groups in accordance with sound data contained in contents or with the type of contents.

In this structure, it is possible to alter the delay time intervals of the rear reverberation groups using the delay time switching device. For example, because the recorded environment differs depending on the contents, and the reverberation time also differs depending on the recorded environment, by altering the delay time intervals of the rear reverberation groups in accordance with the type of contents, it is possible to output rear reverberation whose length is appropriate for the recorded environment in the contents.

(4) In the respective channels, the filter devices set flat frequency characteristics for the rear reverberation groups of the multi channel surround sound signals.

In this structure, because the frequency characteristics are flattened for rear reverberation groups that are attached to the sound of each channel of the multi channel surround sound, it is possible to provide a natural sound atmosphere without adversely affecting the frequency characteristics of the contents.

The stereophonic sound reproduction device of the present invention provides an excellent sound correlation between respective speakers by attaching short-time and accurate rear reverberation that has flat frequency characteristics and matching envelope characteristics to the sound of each channel of multi channel surround sound that is played from the respective speakers. Accordingly, by using the stereophonic sound reproduction device of the present invention, a listener is able to en joy a sensation of being surrounded by natural reverberation sound.

EXPLANATION OF SYMBOLS

Figure 1:
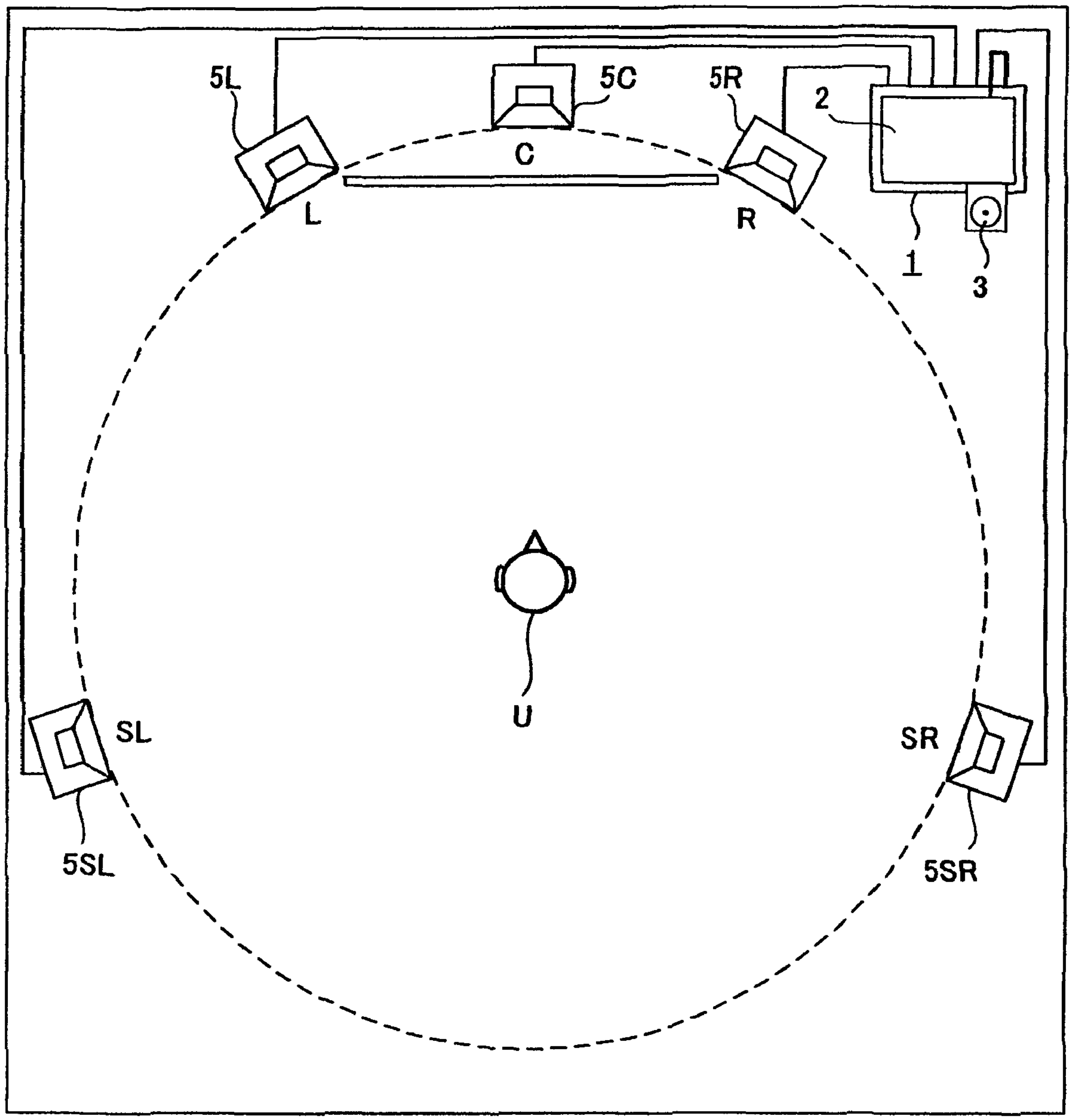
FIG. 1 is a layout diagram showing a state in which a stereophonic sound reproduction device according to an embodiment of the present invention is installed in a listening room.

1—Audio amp
2—DVD player
5 (5R, 5L, 5C, 5SR, 5SL)—Speaker
11 (11R, 11L, 11C, 11SR, 11SL)—Sound signal input terminal
13 (13R, 13L, 13C, 13SR, 13SL)—D/A converter
14 (14R, 14L, 14C, 14SR, 14SL)—Electronic volume
15 (15R, 15L, 15C, 15SR, 15SL)—Power amp (sound amplifying device)
16 (16R, 16L, 16C, 16SR, 16SL)—Sound signal output terminal
17—Memory
18—Controller
19—Operating section
20—Display unit
21 (21R, 21L, 21C, 21SR, 21SL)—Initial reflected sound creation section
22 (22R, 22L, 22C, 22SR, 22SL)—Rear reverberation creation section (rear reverberation creation device)
23 (23R, 23L, 23C, 23SR, 23SL), 43, 46—Adder
32, 35, 42—Multiplier
41, 44—Delay circuit

BEST MODE FOR CARRYING OUT THE INVENTION

Figure 2:
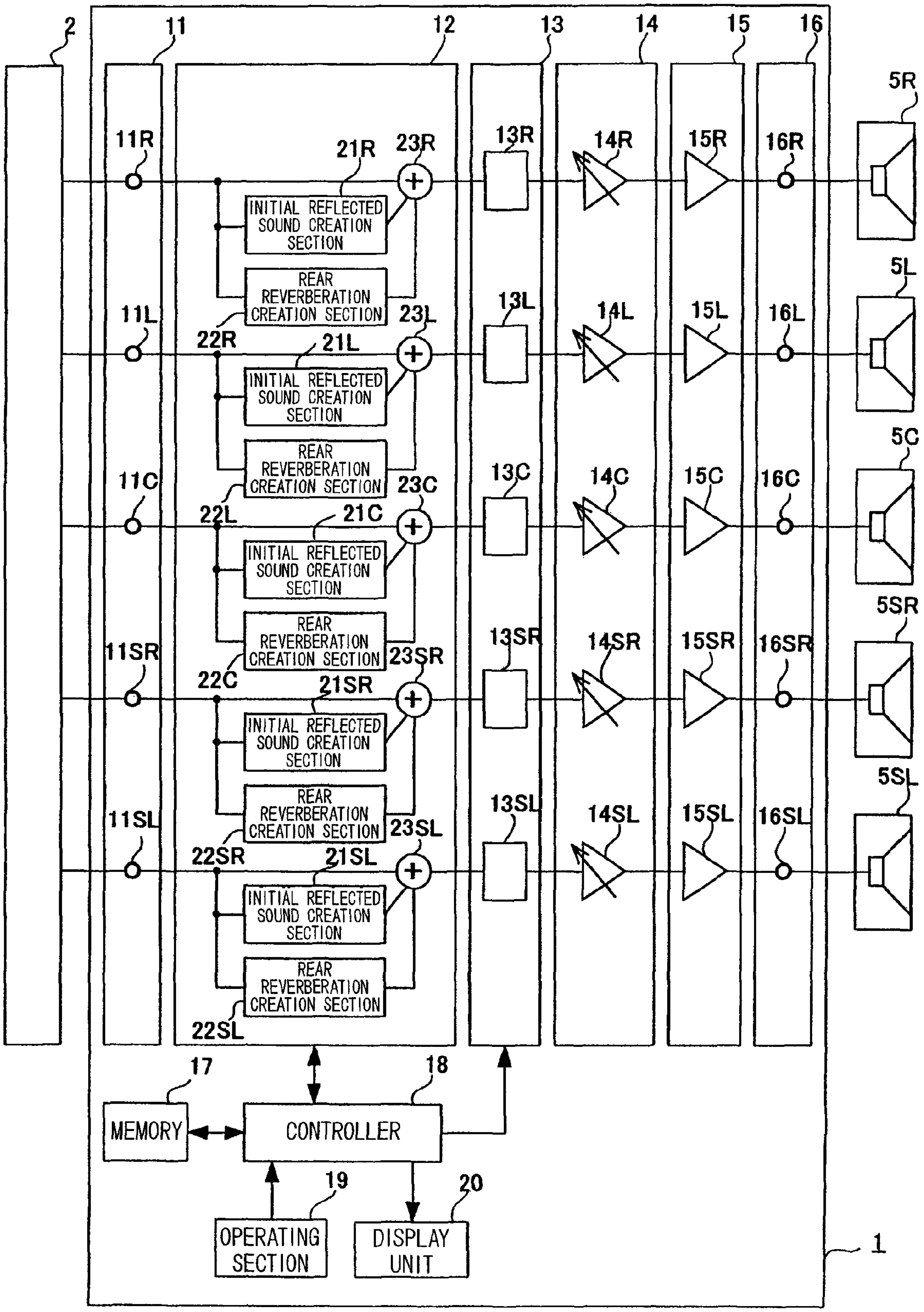
FIG. 2 is a block diagram showing the schematic structure of a stereophonic a sound reproduction device according to an embodiment of the present invention.

FIG. 1 is a layout diagram showing a state in which a stereophonic sound reproduction device according to an embodiment of the present invention is installed in a listening room. FIG. 2 is a block diagram showing the schematic structure of a stereophonic sound reproduction device according to an embodiment of the present invention. In the description below, an audio amp for a 5.1 channel (referred to below as 'ch') surround system is described as an example of a stereophonic sound reproduction device.

Here, in the description below, in a 5.1 ch surround system, a front right channel is referred to as R (i.e., right) ch, a front left channel is referred to as L (i.e., left) ch, a center channel is referred to as C (center) ch, a rear right channel is referred to as SR (i.e., surround right) ch, a rear left channel is referred to as SL (i.e., surround left) ch, and a subwoofer is referred to as LFE (i.e., low frequency effects) ch. In addition, in a 5.1 ch surround system, because LFE ch sound is only output when a deep bass sound has been attached to the contents, a description of processing of an LFE ch sound signal is omitted in the description below.

As is shown in FIG. 1, to an audio amp 1 are connected a DVD player 2, a R ch speaker 5R, a L ch speaker 5L, a C ch speaker 5C, a SR ch speaker 5SR, and a SL ch speaker 5SL. Each speaker may be placed, for example, so as to surround a listening position of a user U in a layout recommended by ITU-R BS. 775-1.

As is shown in FIG. 1, the audio amp 1 processes sound signals of each channel that are output when a DVD 3, on which are recorded contents in which 5.1 ch surround sound has been recorded, is played on the DVD player 2, and the sounds of each channel are output respectively from the R ch speaker 5R, the L ch speaker 5L, the C ch speaker 5C, the SR ch speaker 5SR, and the SL ch speaker 5SL.

As is shown in FIG. 2, the audio amp 1 is provided with a sound signal input terminal 11 (i.e., 11R, 11L, 11C, 11SR, and 11SL), a DSP 12, a D/A converter (DAC) 13 (i.e., 13R, 13L, 13C, 13SR, and 13SL), an electronic volume 14 (i.e., 14R, 14L, 14C, 14SR, and 14SL), a power amp (i.e., sound amplifying device) 15 (i.e., 15R, 15L, 15C, 15SR, and 15SL), a sound signal output terminal 16 (i.e., 16R, 16L, 16C, 16SR, and 16SL), memory 17, a controller 18, an operating section 19, and a display unit 20.

The sound signal input terminal 11 is connected to a sound signal output terminal (not shown) of the DVD player 2, and is used for sound signals output from the DVD player 2 to be input into the audio amp 1. The sound signal input terminal 11 is formed by a R ch sound signal input terminal 11R, a L ch sound signal input terminal 11L, a C ch sound signal input terminal 11C, a SR ch sound signal input terminal 11SR, and a SL ch sound signal input terminal 11SL.

The DSP 12 is provided with an initial reflected sound creation section 21 (i.e., 21R, 21L, 21C, 21SR, and 21SL), a rear reverberation creation section (i.e., rear reverberation creation device) 22 (i.e., 22R, 22L, 22C, 22SR, and 22SL), and an adder 23 (23R, 23L, 23C, 23SR, and 23SL).

Here, 'initial reflected sound' is one of the elements that make up a sound field, and reflected sound that is reflected once by walls and ceilings and reaches a listener in a comparatively short time is called initial reflected sound. In terms of time, it refers to reflected sound that is delayed compared to direct sound so as to arrive within approximately 100 ms.

Rear reverberation is also one of the elements that make up a sound field and is reflected sound that is repeatedly reflected two or more times and reaches a listener after a delay. The time taken for this sound to attenuate to −60 dB is expressed as reverberation time.

The initial reflected sound creation section 21 attaches an initial reflected sound such as that of a hall (i.e., theater) or church to a direct sound (i.e., original sound) of contents that are reproduced by the DVD player 2. Initial reflected sound can be created by applying a setting such that, when initial reflected sound is not included in sound data in the contents, the operating section 19 is operated so as to create initial reflected sound. The rear reverberation creation section 22 creates rear reverberation based on direct sound and initial reflected sound that are included in the contents reproduced by the DVD player 2. The adder 23 adds direct sound and initial reflected sound that are part of the sound in contents that are reproduced by the DVD player 2 to rear reverberation that is created by the rear reverberation creation section 22 and then outputs the result. In addition, the adder 23 adds direct sound that is part of the sound in contents that are reproduced by the DVD player 2 to initial reflected sound that is processed or created by the initial reflected sound creation section 21, and also adds thereto the rear reverberation that is created by the rear reverberation creation section 22 and then outputs the result.

The D/A converter 13 converts digital sound data that is output from the DSP 12 into analog sound data.

The electronic volume 14 controls the volume of sound that is output from the speakers 5 (i.e., 5R, 5L, 5C, 5SR, and 5SL) in accordance with control signals that are output from the controller 18 in accordance with an operation of the operation section 19.

The power amp 15 amplifies sound data that is controlled by the electronic volume 14 and outputs it to each speaker connected to the output terminal 16.

The sound signal output terminal 16 (i.e., 16R, 16S, 16C, 16SR, and 16SL) is used to making connections with each speaker 5 (i.e., 5R, 5L, 5C, 5SR, and 5SL) that plays surround sound.

Each speaker 5 (i.e., 5R, 5L, 5C, 5SR, and 5SL) is connected respectively to a sound signal output terminal 16 (i.e., 16R, 16L, 16C, 16SR, and 16SL), and is placed at predetermined intervals surrounding the listening position of a user U. Each speaker 5 outputs sound in accordance with sound data output from the power amp 15 and thereby forms a surround sound field.

The memory 17 stores a plurality of initial reflected sound patterns created by the initial reflected sound creation section 21 and a plurality of rear reverberation patterns created by the rear reverberation creation section 22. RAM that is able to update parameters (i.e., filter coefficients) for creating initial reflected sound and rear reverberation is favorably used for the memory 17.

The controller 18 controls each section in accordance with operations conducted by the operating section 19. For example, when a volume control operation is performed by the operating section 19, the controller 18 outputs a control signal that corresponds to this operation to the electronic volume 14 so that the volume of the sound that is output from the speaker 5 is altered. When rear reverberation control is performed by the operating section 19, the controller 18 reads reverberation parameters from the memory 17 and outputs them to the rear reverberation creation section 22 of the DSP 12. A CPU or MPU is favorably used for the controller 18.

The operating section 19 is used by a user to input various operations and settings and the like into the audio amp 1.

The display unit 20 is used to display transmission data from the audio amp 1 to a user.

Figure 3:
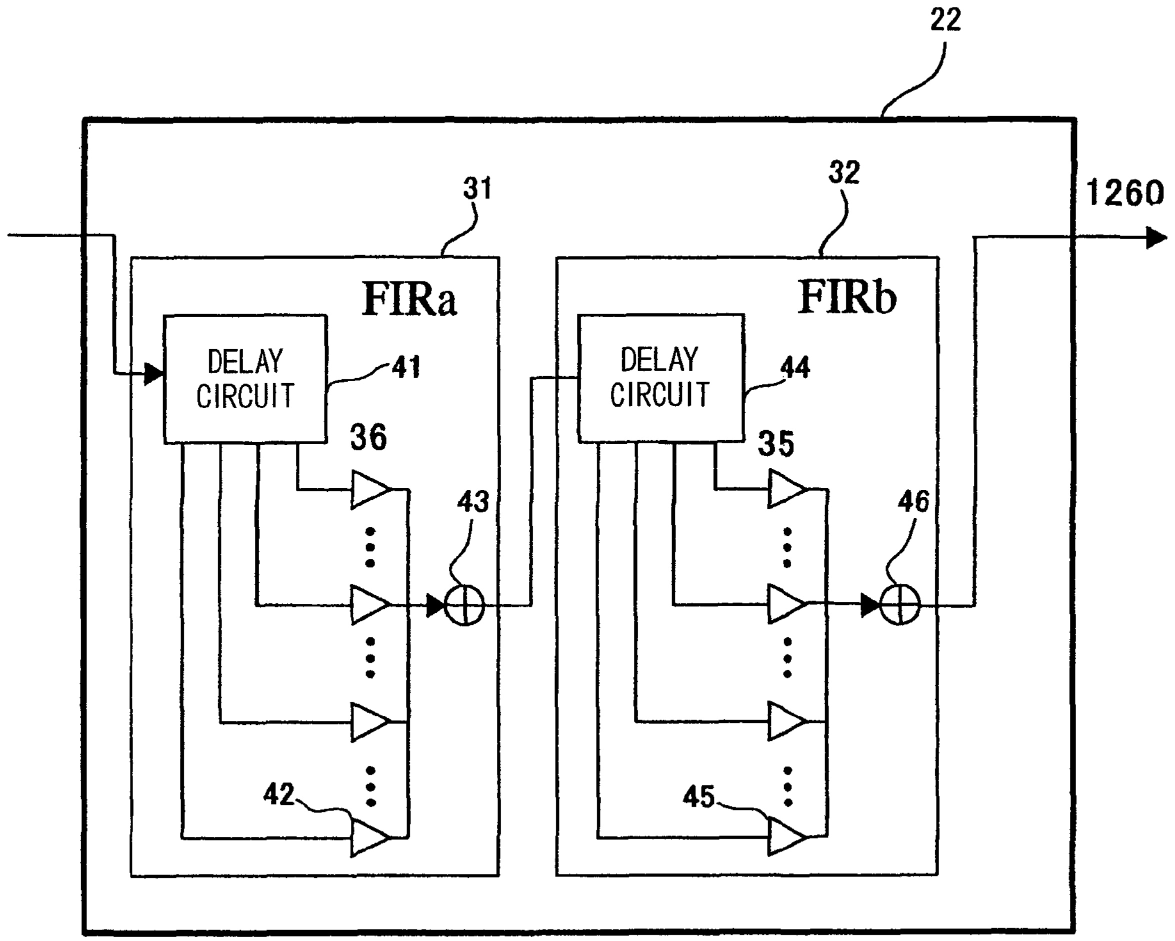
FIG. 3 is a circuit diagram showing the detailed structure of a reverberation creation portion of a stereophonic sound reproduction device according to an embodiment of the present invention.
Figure 4:
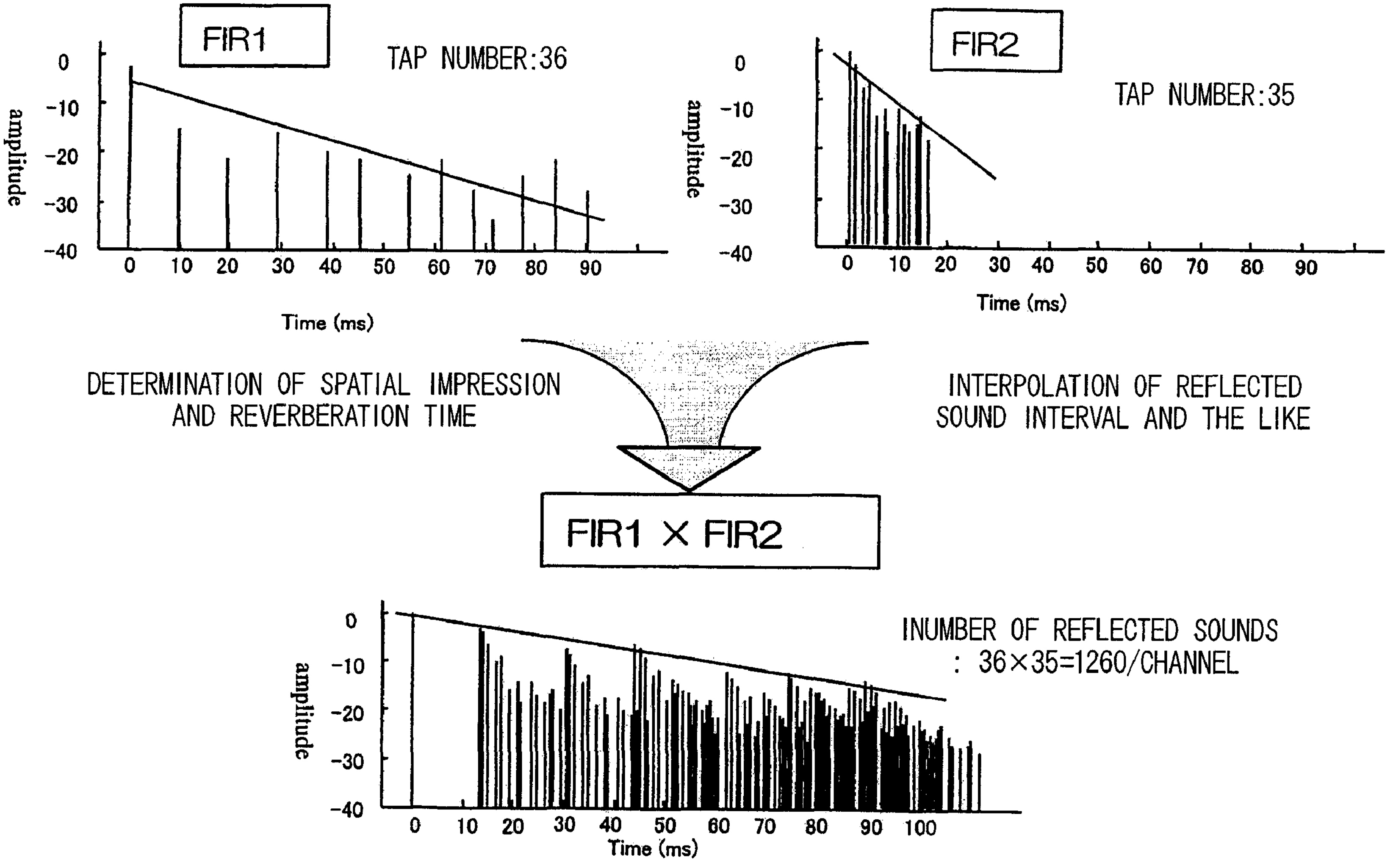
FIG. 4 is a view showing a reverberation group created by a cascade type FIR filter.

Next, the rear reverberation creation section 22 of the DSP 12 will be described in detail. FIG. 3 is a circuit diagram showing in detail the structure of a reverberation creation section of the stereophonic sound reproduction device according to an embodiment of the present invention. FIG. 4 is a view showing a reverberation group created by a cascade type FIR filter. FIG. 5 is a graph showing reverberation frequency characteristics and gain characteristics. Note that in FIG. 4 only a positive reverberation group is shown.

The rear reverberation creation section 22 is provided with a cascade type of FIR filter (i.e., filter device) in which two FIR filters are cascade connected. FIG. 3 shows as an example thereof a structure in which an FIR filter a 31 and an FIR filter b 32 are cascade connected. The FIR filter a 31 is formed by a delay circuit 41, 36 multipliers 42, and an adder 43. The FIR filter b 32 is formed by a delay circuit 44, 35 multipliers 45, and an adder 46. In this rear reverberation creation section 22 the tap number of the FIR filter a 31 is set to 36, while the tap number of the FIR filter b 32 is set to 35. The rear reverberation creation sections 22R, 22L, 22C, 22SR, and 22SL each have the same structure and attach rear reverberation to sound signals of the respective channels Rch, Lch, Cch, SRch, and SLch.

In the rear reverberation creation section 22, when rear reverberation is attached to the sound of particular contents, the controller 18 preliminarily reads parameters (i.e., a filter coefficient) from the memory 17 and sets them in each rear reverberation creation section 22. Namely, parameters that determine spatial impressions and reverberation time are set in the FIR filter a 31 and multiplier 42. Parameters that are used for interpolating reflected sound intervals are set in the FIR filter b 32 and the multiplier 45. Accordingly, by performing convolution computations on the sound signals of each channel using the reflected sound parameters set in the rear reverberation creation section 22, as is shown in FIG. 4, the reverberation group (i.e., the number of reflected sounds) can be set to 1260.

In the FIR filter a 31, parameters (i.e., filter coefficients) are set in order to determine the spatial impression and the reverberation time as is described above. For example, as is shown in FIG. 4, the reverberation group having 36 taps is attenuated within approximately 100 milliseconds, and the average of the delay time interval is substantially constant, however, a setting is made such that, as time passes, the delay time interval becomes gradually shorter. Moreover, the reverberation group having 36 taps is set having envelope characteristics so as to become gradually attenuated over time in order to provide a natural sound.

In contrast, in the FIR filter b 32, parameters (i.e., filter coefficients) are set in order to perform interpolation on the reflected sound interval as is described above. For example, as is shown in FIG. 4, the reverberation group having 35 taps is attenuated within approximately 15 milliseconds, and the average of the delay time interval is substantially constant, however, a setting is made such that, as time passes, the delay time interval becomes gradually shorter. Moreover, the reverberation group having 35 taps is set having envelope characteristics of an attenuation curve that is steeper than the envelope characteristics of the reverberation group having 36 taps of the FIR filter a 31.

Furthermore, although omitted from the drawings, in the rear reverberation groups of respective channels created in the respective rear reverberation creation sections 22R, 22L, 22C, 22SR, and 22SL, the envelope characteristics are the same in the respective channels. However, the parameters read from the memory 17 are set such that the delay time intervals of the reverberation groups are different for the respective channels. In addition, the parameters of the respective FIR filters are set such that the frequency characteristics of the rear reverberations generated by the cascade type FIR filters are flat.

In addition, when cascade type FIR filters are not used but, instead, normal FIR filters are used, 1260 times of operations (i.e., delay circuits, multipliers, adders, and the like) are needed. However, by employing cascade type FIR filters, as in the present invention, it is possible to set the same number of parameters (i.e., 1260=35×36) using 71 (i.e., 35+36) times of operations. Accordingly, it is possible to control the size of the circuit used to create the rear reverberation parameters, and, with only a small amount of computation processing, as is shown in FIG. 4, the density of the reverberation groups increases over time, and it becomes possible to create reverberation groups having non-uniform (i.e., random) delay time intervals.

Figure 5A:
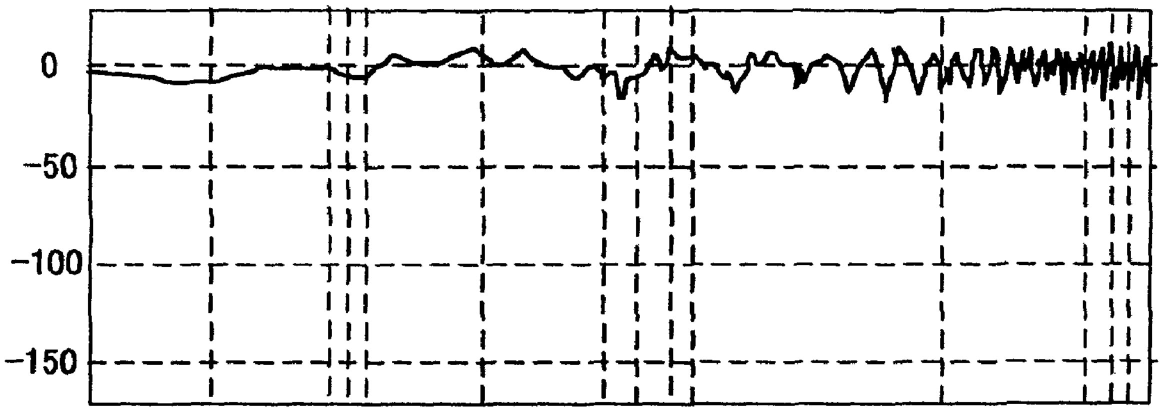
FIG. 5A is a graph showing reverberation frequency characteristics and gain characteristics.
Figure 5B:
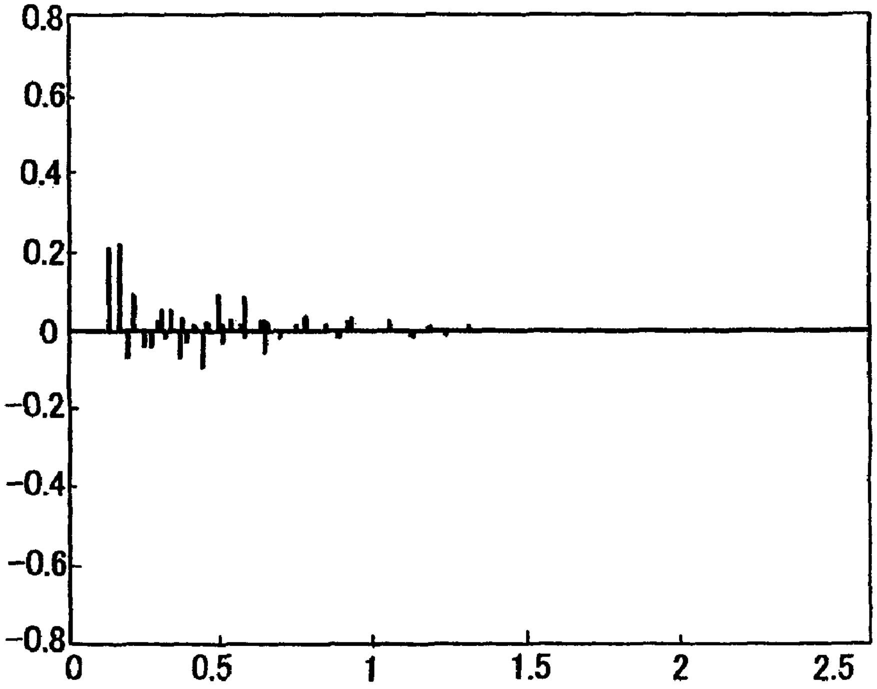
FIG. 5B is a graph showing reverberation frequency characteristics and gain characteristics.

Moreover, because the rear reverberation has flat frequency characteristics, as is shown in FIG. 5A, there are no adverse affects on the frequency characteristics of the contents and it is possible to provide the natural sound of an attenuation curve such as that shown in FIG. 5B. Furthermore, because the delay time of the rear reverberation is different for each channel, it is possible to prevent the rear reverberation of each channel becoming monaural and the sound of the rear reverberation is able to be softened. In addition, because the envelopes of the rear reverberation of each channel are substantially the same, the rear reverberation is attached to the sound output from each speaker and the same atmospheric sound can be output from the speaker of each channel. As a result, it is possible to match the rear reverberation atmospheres of the sound that is output from each speaker connected to the audio amp 1, so that an excellent sound correlation is obtained between each speaker.

The parameters for the FIR filter a and the FIR filter b of each channel may be set in advance such that reverberation having a natural atmosphere is created and stored in the memory 17 based on actual measured data without the sound of the contents being manipulated. Moreover, the delay time intervals in the parameters are random values and are set to a different value for each channel, however, they may be set, for example, to random values such as prime numbers (i.e., 2, 3, 5, 7, 11).

Moreover, in the audio amp 1, it is possible to alter the filter coefficient of an FIR filter in accordance with the type of contents reproduced by the DVD player 2 and sound data contained in the contents.

For example, depending on whether or not initial reflected sound is included in the sound in the contents, by altering the filter coefficient it is possible to alter the delay time interval. Moreover, by setting the delay time interval when rear reverberation is created from direct sound and the delay time interval when rear reverberation is created from initial reflected sound to different values, it is possible to create rear reverberation that has a natural sound.

It is also possible to alter the delay time interval in accordance with the location where contents are recorded. Namely, reverberation characteristics differ depending on the recording location. Therefore, if, for example, a comparison is made between contents recorded in a jazz bar and contents recorded in a church, the reverberation time is longer for the contents recorded in a church. Because the sound atmosphere differs depending on the location where the contents being reproduced were recorded, by operating the operating section 19 so that the delay time interval is altered in accordance with the recording location, the optimum rear reverberation can be attached to the particular contents and a user can listen to a reverberation without any sense of incongruousness.

Here, as is shown in FIGS. 3 and 4, in the audio amp 1 of the present invention, reverberation is created using cascade type FIR filters, however, as is described above, when altering the reverberation time of a reverberation sound, it is also possible to set parameters such that the tap number of the FIR filter a 31 and the value of the envelope characteristics are changed.

Figure 6:
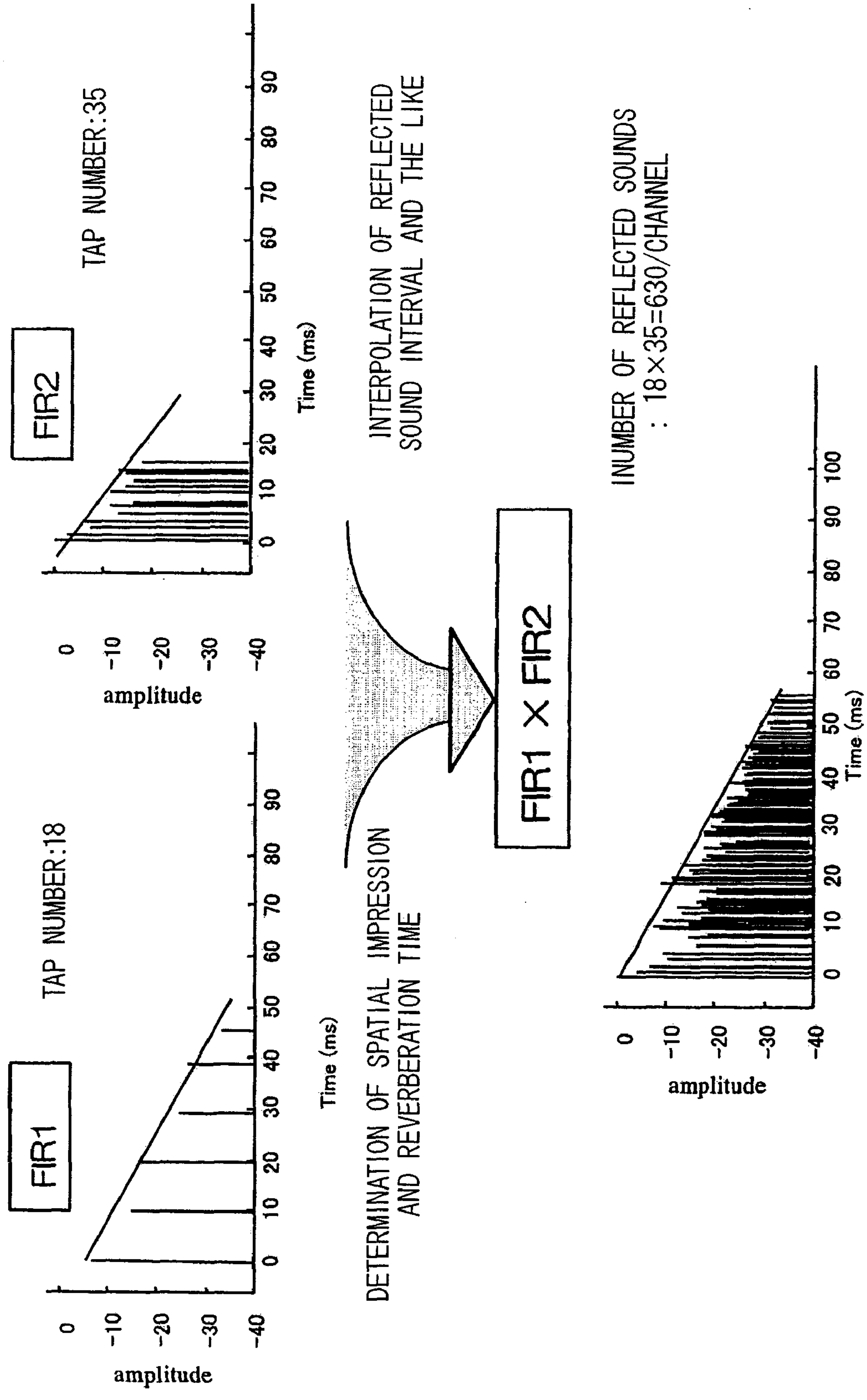
FIG. 6 is a view showing a reverberation group created when parameters set in a cascade type FIR filter are altered.

FIG. 6 is a view showing a reverberation group created when parameters set for a cascade type FIR filter are altered. Note that, in FIG. 6, only a positive reverberation group is shown. For example, as is shown in FIG. 6, reverberation group having 18 taps is attenuated within approximately 50 milliseconds, and the average of the delay time interval is substantially constant, however, parameters are set such that, as time passes, the delay time interval becomes gradually shorter. Moreover, the parameters are set such that the reverberation group having 36 taps has envelope characteristics such that they become gradually attenuated over time in order to provide a natural sound. In contrast, in the FIR filter b 32, as is shown in FIG. 6, the reverberation group having 35 taps is attenuated within approximately 15 milliseconds, and the average of the delay time interval is substantially constant, however, a setting is made such that, as time passes, the delay time interval becomes gradually shorter. Moreover, the parameters are set such that the reverberation group having 35 taps has envelope characteristics of an attenuation curve that is steeper than the envelope characteristics of the reverberation group having 18 taps of the FIR filter a 31. As a result, in the rear reverberation creation section 22, as is shown in FIG. 6, it is possible to create reverberation that is attenuated within approximately 50 to 60 milliseconds.

If a longer reverberation time than the reverberation shown in FIG. 4 is desired, then it is possible to further increase the number of taps in the FIR filter a 31, and also set the parameters such that the envelope characteristics become gradually attenuated over time so that the reverberation provides a natural sound. As a result, it is possible to alter the reverberation time of a reverberation sound in accordance with the sound data contained in the contents or with the type of contents, and attach the optimum rear reverberation to the contents. A user is thereby able to listen to a reverberation without any sense of incongruousness.

Note that the above description uses a 5.1 ch surround system as an example, however, the present invention is not limited to this structure. It is to be understood that the present invention can also be applied to a structure having a different number of channels provided that the stereophonic sound reproduction device is one that outputs multi channel surround sound signals to a plurality of speakers that are connected to a main unit. For example, the number of channels may be changed to 3, 7, 9 or the like.

INDUSTRIAL APPLICABILITY

According to the stereophonic sound reproduction device of the present invention, a listener is able to enjoy a sense of being enveloped in a natural reverberation sound atmosphere.

The invention claimed is:

1. A stereophonic sound reproduction device comprising:

an input section for receiving multi-channel sound signals;

a digital signal processor (DSP) that processes the input multi-channel sound signals; and a sound amplifying device that amplifies the input multi-channel surround sound signals for respective channels processed by the DSP and outputs the multi-channel surround sound signals to a plurality of speakers located surrounding a listening position, wherein the DSP comprises:

an initial reflection sound creation section that provides first delays to respective channels of the input multi-channel sound signals;

a rear reverberation creation device that provides second delays different from the first delays to respective channels of the input multi-channel sound signals; and an adding device that adds the sound signals from the initial reflection sound creation device and the rear reverberation creation device to the original sound signals separately for each of the respective channels, and outputs the added sound signals to the sound amplifying device, wherein the rear reverberation creation device has filter devices for the respective channels whose delay time intervals are non-uniform and different for the respective channels, and whose envelope characteristics are the same for the respective channels, and wherein the rear reverberation creation device performs convolution computations on the multi-channel surround sound signals using the filter devices that correspond to the respective channels, creates rear reverberation groups, and outputs the rear reverberation groups to the sound amplifying device.

2. The stereophonic sound reproduction device according to claim 1, wherein the filter devices are cascade type FIR filters that perform the convolution computations.

3. The stereophonic sound reproduction device according to claim 1, further including a controller that controls delay time intervals of the rear reverberation groups in accordance with sound data contained in contents or with the type of contents.

4. The stereophonic sound reproduction device according to claim 1, wherein, in the respective channels, the filter devices set flat frequency characteristics for the rear reverberation groups of the multi-channel surround sound signals.

* * * * *